(12) United States Patent
Qian

(10) Patent No.: US 10,912,212 B1
(45) Date of Patent: Feb. 2, 2021

(54) DISPLAY DEVICE

(71) Applicant: Shanghai Tianma AM-OLED Co., Ltd., Shanghai (CN)

(72) Inventor: Xingchen Qian, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/727,203

(22) Filed: Dec. 26, 2019

(30) Foreign Application Priority Data

Oct. 31, 2019 (CN) .......................... 2019 1 1051706

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC ........................... H05K 5/0217; H05K 5/0017
See application file for complete search history.

(56) References Cited

U.S. PATENT DOCUMENTS

| | | | |
|---|---|---|---|
| 9,235,239 B2* | 1/2016 | Van Dijk | G09F 9/301 |
| 9,910,458 B2* | 3/2018 | Watanabe | G02F 1/133305 |
| 10,440,840 B2* | 10/2019 | Ochi | H04M 1/022 |
| 2012/0243207 A1* | 9/2012 | Wang | G09F 9/30 |
| | | | 362/97.1 |
| 2018/0232011 A1* | 8/2018 | Jiang | G09F 9/301 |

FOREIGN PATENT DOCUMENTS

| | | |
|---|---|---|
| CN | 106233362 A | 12/2016 |
| CN | 109196448 A | 1/2019 |

* cited by examiner

*Primary Examiner* — Rockshana D Chowdhury
(74) *Attorney, Agent, or Firm* — Anova Law Group PLLC

(57) ABSTRACT

A display device is provided. The display device includes a flexible display panel having a flattened state and a folded state, a support mechanism located on a non-display surface side of the flexible display panel, two rotation mechanisms, and two telescopic mechanisms located on a side of the support mechanism facing away from the flexible display panel. The support mechanism includes two first support parts at two sides and one second support part in middle. The rotation mechanisms are located on a side of the second support part facing away from the flexible display panel. Each telescopic mechanism includes a traction part and a winding part. When the flexible display panel is in the flattened state, the winding parts are wound around the rotation mechanisms. When the flexible display panel is in the folded state, the winding parts are pulled out by the traction parts.

20 Claims, 10 Drawing Sheets

DISPLAY DEVICE

CROSS-REFERENCES TO RELATED APPLICATIONS

This application claims priority of Chinese Patent Application No. 201911051706.X, filed on Oct. 31, 2019, the entire content of which is hereby incorporated by reference.

FIELD OF THE DISCLOSURE

The present disclosure generally relates to the field of display technology and, more particularly, relates to a display device.

BACKGROUND

In recent years, flexible and bendable display panels have been developed and widely used. However, during a transition process of a display panel from a flat state to a bent state, a bending-axis part of the display panel may be stretched and compressed. When a bending angle exceeds a certain value, the flexible display panel may suffer unacceptable damage, resulting in undesirable display of images at the bending-axis part.

SUMMARY

One aspect of the present disclosure includes a display device. The display device includes a flexible display panel. The flexible display panel has a flattened state and a folded state. The display device also includes a support mechanism located on a non-display surface side of the flexible display panel. The support mechanism includes three support parts arranged in order when the flexible display panel is in the flattened state, and the three support parts include two first support parts located on two sides of the flexible display panel and a second support part located in middle of the flexible display panel. A bending axis part is located at a region of the flexible display panel between any two adjacent support parts. The display device also includes two rotation mechanisms located on a side of the second support part facing away from the flexible display panel. Rotation axes of the rotation mechanisms are parallel to a bending axis of the flexible display panel. The display device also includes two telescopic mechanisms located on a side of the support mechanism facing away from the flexible display panel. Each telescopic mechanism includes a traction part and a winding part, first ends of the two traction parts are respectively fixed to sides of the two first support parts facing away from the flexible display panel, the two winding parts are respectively wound around the two rotation mechanisms, first ends of the two winding parts are respectively fixed on the rotation mechanisms, and second ends of the two winding parts are respectively connected to second ends of the two traction parts. When the flexible display panel is in the flattened state, the winding parts are wound around the rotation mechanisms. When the flexible display panel is in the folded state, the winding parts are pulled out by the traction parts.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that relative arrangements of components and steps, numerical expressions and numerical values set forth in exemplary embodiments are for illustration purpose only and are not intended to limit the present disclosure unless otherwise specified. Techniques, methods and apparatus known to the skilled in the relevant art may not be discussed in detail, but these techniques, methods and apparatus should be considered as a part of the specification, where appropriate.

Figure 1A:
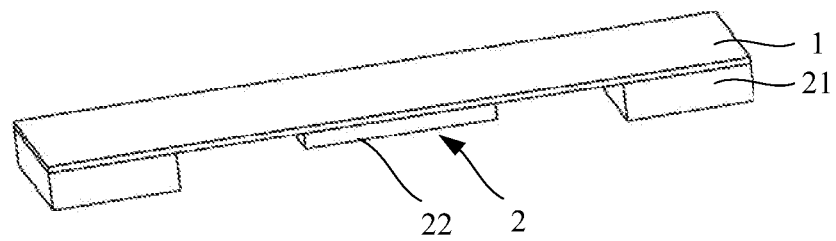
FIG. 1a illustrates a structural diagram of a flexible display panel and a support mechanism consistent with the disclosed embodiments of the present disclosure.
Figure 1B:
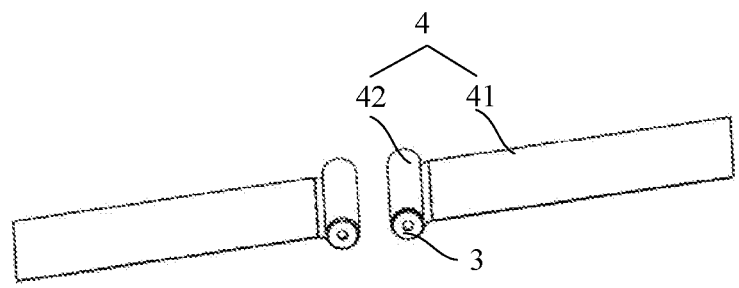
FIG. 1b illustrates a structural diagram of a rotation mechanism and a telescopic mechanism consistent with the disclosed embodiments of the present disclosure.

FIG. 1a illustrates a structural diagram of a flexible display panel and a support mechanism consistent with the disclosed embodiments of the present disclosure. FIG. 1b illustrates a structural diagram of a rotation mechanism and a telescopic mechanism consistent with the disclosed embodiments of the present disclosure. Referring to FIG. 1a and FIG. 1b, a display device provided by the present disclosure includes a flexible display panel 1, a support mechanism 2, two rotation mechanisms 3, and two telescopic mechanisms 4.

The flexible display panel 1 has a flattened state and a folded state. The support mechanism 2 is located on a non-display surface side of the flexible display panel 1. The support mechanism 2 includes three support parts arranged in order when the flexible display panel 1 is in the flattened state. The three support parts include two first support parts 21 located on two sides of the flexible display panel 1 and a second support part 22 located in middle of the flexible display panel 1. A bending axis is disposed at a part of the flexible display panel 1 between any two adjacent support parts.

The two rotation mechanisms 3 are located on a side of the second support part 22 facing away from the flexible display panel 1. Rotation axes of the rotation mechanisms 3 are parallel to the bending axis of the flexible display panel 1.

The two telescopic mechanisms 4 are located on a side of the support mechanism 2 facing away from the flexible display panel 1. Each telescopic mechanism 4 includes a traction part 41 and a winding part 42. First ends of the two traction parts 41 are respectively fixed to sides of the two first support parts 21 facing away from the flexible display panel. The two winding parts 42 are respectively wound around the two rotation mechanisms 3. First ends of the two winding parts 42 are respectively fixed on the rotation mechanisms 3, and second ends of the two winding parts 42 are respectively connected to the second ends of the two traction parts 41.

When the flexible display panel 1 is in a flattened state, the winding parts 42 are wound around the rotation mechanisms 3. When the flexible display panel 1 is in a folded state, the winding parts 42 are pulled out by the traction parts 41.

Figure 2A:
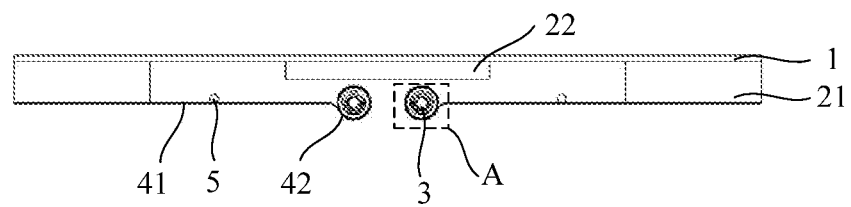
FIG. 2a illustrates a structural diagram of an exemplary display device consistent with the disclosed embodiments of the present disclosure.

FIG. 2a illustrates a structural diagram of an exemplary display device consistent with the disclosed embodiments of the present disclosure. In one embodiment, as shown in FIG. 2a, the support mechanism 2 is located on a non-display surface side of the flexible display panel 1. The support mechanism 2 specifically includes three support parts arranged in order when the flexible display panel 1 is in a flattened state. The flexible display panel 1 includes three flat and straight regions. A region of the flexible display panel 1 located between two adjacent support parts includes a bending axis, and is a bendable region. The two rotation mechanisms 3 are disposed on a side of the second support part 22 facing away from the flexible display panel. Rotation axes of the rotation mechanisms 3 are parallel to the bending axes of the flexible display panel 1. The two telescopic mechanisms 4 are located on the side of the support mechanism 2 facing away from the flexible display panel 1. Each telescopic mechanism 4 specifically includes a traction part 41 and a winding part 42. The first ends of the two traction parts 41 are respectively fixed to the sides of the two first support parts 21 facing away from the flexible display panel 1, and the two first support parts 21 are located at the two sides of the flexible display panel 1.

Figure 3A:
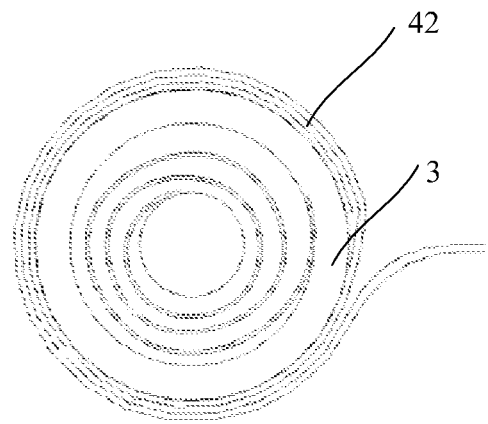
FIG. 3a illustrates an enlarged view of area A in FIG. 2a, consistent with the disclosed embodiments of the present disclosure.

FIG. 3a illustrates an enlarged view of area A in FIG. 2a. Referring to FIG. 3a, the two winding parts 42 are respectively wound on the two rotation mechanisms 3, and the first ends of the winding parts 42 are respectively fixed on the rotation mechanisms 3. The second ends of the winding parts 42 are respectively connected to the second ends of the two traction parts 41. When the flexible display panel 1 is in a flattened state, the two winding parts 42 are wound on the two rotation mechanisms 3.

Figure 2B:
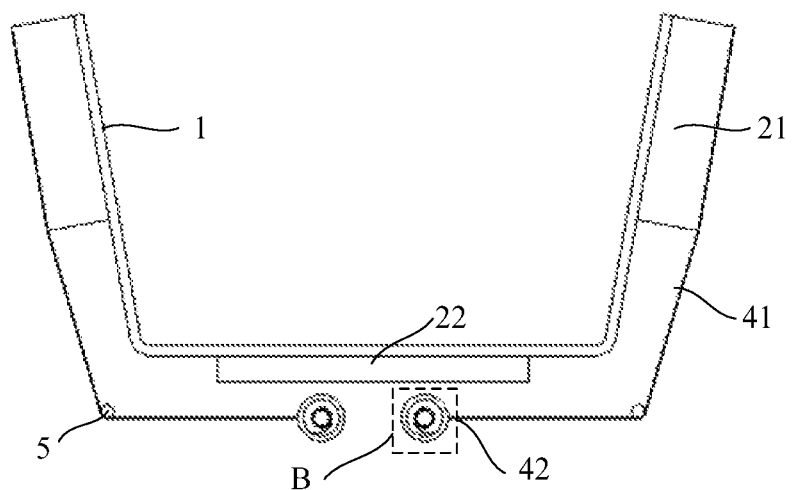
FIG. 2b illustrates a state diagram of an exemplary display device consistent with the disclosed embodiments of the present disclosure.

FIG. 2b illustrates a state diagram of an exemplary display device consistent with the disclosed embodiments of the present disclosure. As shown in FIG. 2b, when the flexible display panel 1 is in a folded state, regions of the flexible display panel 1 corresponding to the two first support parts 21 may be folded toward a side facing away from the support parts. The first support parts 21 may drive the traction parts 41 to move, and the traction parts 41 may pull out the winding parts 42 from the rotation mechanisms 3. When the winding parts 42 are completely pulled out from the rotation mechanisms, the flexible display panel 1 may reach a preset safety angle, and the flexible display panel 1 may not continue to be folded.

The flexible display device may compensate, through the telescopic mechanisms 4, the stretch and compression on the flexible display panel 1 during a folding process. A length of the winding parts 42 of the telescopic mechanisms 4 may limit a maximum bending angle of the flexible display panel. Accordingly, when a bending-axis part of the flexible display panel 1 bends, excessive stretch and compression may be avoided, and unacceptable damage to the flexible display panel 1 affecting image display may thus be avoided.

It should be noted that, to achieve a reliable limitation on the bending angle of the flexible display panel 1, the traction parts 41 and the winding parts 42 of the telescopic mechanisms 4 are made of inelastic telescopic materials. A total length of the telescopic mechanism 4 is fixed and may not be changed. In this way, when the flexible display panel 1 bends to a preset maximum angle, the winding parts 42 may not continue to be pulled out by the traction parts 41, thus limiting the bending angle.

Figure 1C:
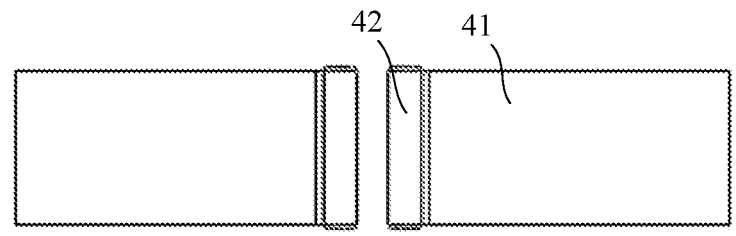
FIG. 1c illustrates a structural diagram of a traction part consistent with the disclosed embodiments of the present disclosure.

FIG. 1*c* illustrates a structural diagram of a traction part consistent with the disclosed embodiments of the present disclosure. In one embodiment, as shown in FIG. 1*c*, the traction part 41 has a sheet-shaped structure. The first end of the sheet-shaped traction part 41 is fixedly connected to the side of the first support part 21 facing away from the flexible display panel 1. The second end of the sheet-shaped traction part 41 is connected to the second end of the winding part 42. With the sheet-shaped traction part 41, when the flexible display panel 1 bends, the flexible display panel 1 may receive a uniform bending force, and damage to the flexible display panel 1 may be avoided. Specifically, the traction part 41 may include one or more sheet-shaped structures. The number of sheet-shaped structures may be determined according to actual conditions, and is not limited by the present disclosure.

In one embodiment, in the telescopic mechanism 4, the winding part 42 connected to the traction part 41 may be a sheet-shaped structure wound around the rotation mechanism 3. When the sheet-shaped winding part 42 is pulled out, stress on the flexible display panel may be uniform, and thus damage to the flexible display panel 1 due to uneven stress during a bending process may be avoided. Specifically, the winding part 42 may include one or more sheet-shaped structures wound on the rotation mechanism 3. When the traction part includes a plurality of sheet-shaped structures and the winding part also includes a plurality of sheet-shaped structures, the sheet-shaped structures of the traction part and the sheet-shaped structures of the winding part may be connected in one-to-one correspondence.

Specifically, since the traction part 41 and the winding part 42 are connected, the traction part 41 and the winding part 42 of the telescopic mechanism 4 may be directly formed integrally. The traction part 41 and the winding part 42 formed integrally may have a simple structure and a low cost, and may be easy for assembly. Also, the traction part 41 and the winding part 42 may not be an integrated structure, and the traction part 41 and the winding part 42 may be connected through a connection structure. The present disclosure does not limit the connection structure between the traction part 41 and the winding part 42.

Specifically, when the traction part 41 and the winding part 42 are integrally formed, the telescopic mechanism 4 may be an ultra-thin metal sheet. A first end of the ultra-thin metal sheet is fixed to the rotation mechanism 3, and a region of the ultra-thin metal sheet close to the first end is wound around the rotation mechanism 3. The second end of the ultra-thin metal sheet is fixedly connected to the side of the first support part 21 facing away from the display panel.

The ultra-thin metal sheet may have advantages of thin thickness, light weight, and rigidity. Since the ultra-thin metal sheet is thin, the ultra-thin metal sheet may endure bending and may not easily break. Since the ultra-thin metal sheet has a certain rigidity, during a folding process of the flexible display panel, the ultra-thin metal sheet may provide a support function, making the flexible display panel flat and difficult to deform. Further, since the ultra-thin metal sheet has a light weight, when the flexible display panel is in a flattened state, deformation of the flexible display panel due to a weight of the telescopic mechanism may be avoided. The ultra-thin metal sheet may have a thickness in a range of approximately 0.05 mm-0.1 mm. In practical applications, the thickness of the ultra-thin metal sheet may be determined according to actual conditions, and the present disclosure does not limit the thickness of the ultra-thin sheet. The ultra-thin metal sheet may be made of metal including iron or aluminum.

Figure 3B:
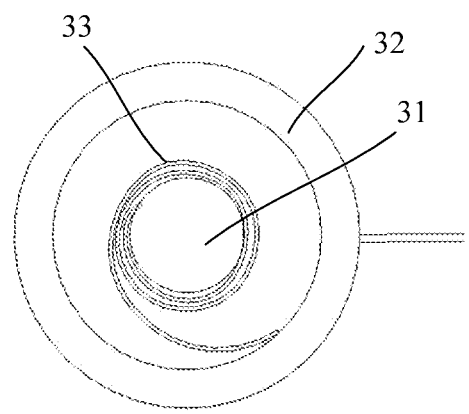
FIG. 3b illustrates an enlarged view of area B in FIG. 2b, consistent with the disclosed embodiments of the present disclosure.

FIG. 3*b* illustrates an enlarged view of area B in FIG. 2*b*. In one embodiment, as shown in FIG. 3*b*, the rotation mechanism 3 may specifically include a fixed central axis 31, a rotary table 32 rotatable on the central axis 31, and an elastic reset part 33 connected to the central axis 31 and the rotary table 32 respectively. The winding part 42 is wound on the rotary table 32, and the first end of the winding part 42 is fixed on the rotary table 32.

Specifically, when the flexible display panel 1 is in a flattened state, the winding part 42 is wound on the rotary table 32, and the elastic reset part 33 is in an initial state. When the display panel is folded, movement of the support part drives movement of the traction part 41. The traction part 41 pulls the winding part 42 out from the rotary table 32, such that the rotary table 32 rotates around the central axis 31. The elastic reset part 33 between the rotary table 32 and the central axis 31 generates a counterforce on the rotary table 32 due to the rotation of the rotary table 32, resulting in a stressed state. When the flexible display panel 1 needs to be flattened after being folded, the elastic reset part 33 drives the rotary table 32 to rotate in an opposite direction, such that the winding part 42 is wound on the rotary table 32. The winding part 42 drives the traction part 41 to move, and the traction part 41 drives the flexible display panel 1 to restore a flattened state, such that a flattened state of the flexible display panel 1 is achieved. During a process of folding the flat display panel 1 and restoring the flattened state, due to functions of the elastic reset part 33, the display device may have an elastic feel, and a user may thus have a good experience.

Specifically, the elastic reset part 33 may be a torsion spring. The torsion spring is disposed between the central axis 31 and the rotary table 32. One end of the torsion spring is connected to the central axis 31 and the other end is connected to an inner wall of the rotary table 32. During a folding process of the flexible display panel 1, the traction part 41 drives the winding part 42 to be pulled out from the rotary table 32, and the rotary table 32 follows the winding part 42 to rotate around the central axis 31. The torsion spring with one end fixed to the inner wall of the rotary table 32 may be gradually tightened due to the rotation of the rotary table 32, reaching a stressed state. When the flexible display panel needs to be flattened, the torsion spring and the traction part may drive the flexible display panel 1 to be flattened.

It should be noted that, in the display device, in a process of the torsion spring and the traction part driving the flexible display panel to restore the flattened state, when the flexible display panel is completely flattened, the torsion spring returns to the initial state. To avoid pulling the flexible display panel in a direction opposite to a direction in which the flexible display panel is folded, when the torsion spring is in the initial state, a stress of the torsion spring is zero. Or, when the torsion spring is in the initial state, a spring limit structure disposed on the rotation mechanism may limit the torsion spring.

Figure 4:
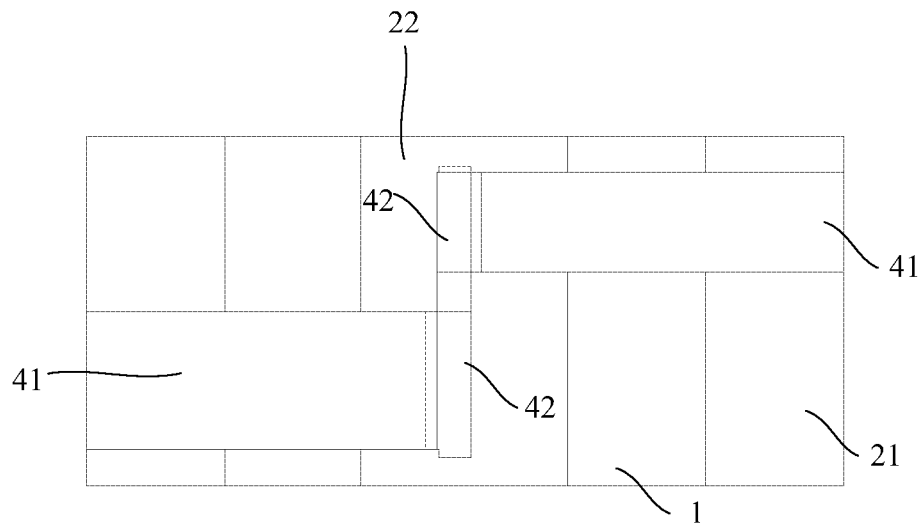
FIG. 4 illustrates a structural diagram of an exemplary display device consistent with the disclosed embodiments of the present disclosure.

FIG. 4 illustrates a structural diagram of an exemplary display device consistent with the disclosed embodiments of the present disclosure. In one embodiment, as shown in FIG. 4, the display device includes two rotation mechanisms 3 sharing a same central axis 31. The two rotary tables 32 are on the same central axis 31 in an offset manner. The elastic reset parts 33 are disposed between the central axis 31 and the rotary tables 32. The winding parts 42 of the two telescopic mechanisms 4 are respectively wound on the two rotary tables 32, and the traction parts 41 of the two telescopic mechanisms 4 are respectively connected to the two first support parts 21. When the flexible display panel 1 is folded, the winding parts 42 are pulled out from the rotary tables 32 under the traction of the two traction parts 41, and the two rotary tables 32 rotate in opposite directions around the same central axis 31. When the winding parts 42 are fully pulled out, the flexible display panel 1 may reach a preset safe angle, and the flexible display panel 1 may not be further folded. The bending angle of the flexible display panel 1 is limited through the length of the telescopic mechanism 4, such that the bending of the flexible display panel 1 may not cause excessive stretch and compression, and unacceptable damage to the flexible display panel 1 affecting image display may be avoided.

Figure 5A:
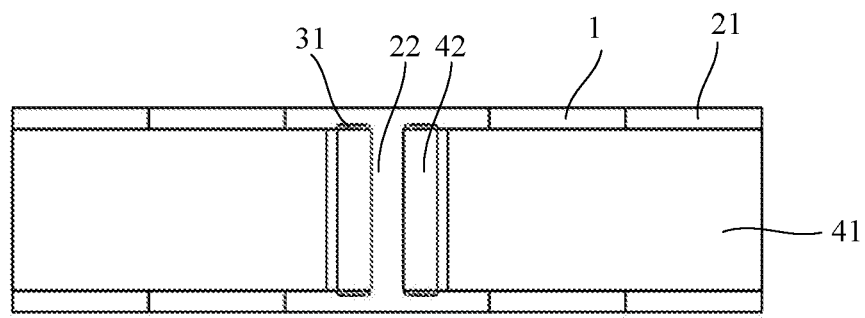
FIG. 5a illustrates a structural diagram of an exemplary display device consistent with the disclosed embodiments of the present disclosure.

FIG. 5a illustrates a structural diagram of an exemplary display device consistent with the disclosed embodiments of the present disclosure. In one embodiment, as shown in FIG. 5a, in the two rotation mechanisms 3, each rotation mechanism 3 includes a central axis 31, and the two central axes 31 of the two rotation mechanisms are arranged side by side. The rotary tables 32 are on the central axes 31 in one to one correspondence. The winding parts 42 of the two telescopic mechanisms 4 are wound on the two rotary tables 32 in one to one correspondence. The two traction parts 41 are connected to the winding parts in one to one correspondence.

Figure 5B:
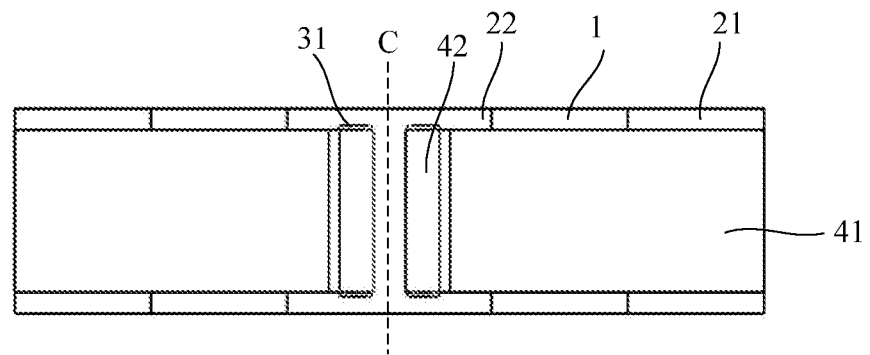
FIG. 5b illustrates a structural diagram of an exemplary display device consistent with the disclosed embodiments of the present disclosure.

FIG. 5b illustrates a structural diagram of an exemplary display device consistent with the disclosed embodiments of the present disclosure. As shown in FIG. 5b, when the two rotation mechanisms 3 have two central axes 31, the two rotary tables 32 may be symmetrically arranged along a symmetry axis C of the flexible display panel parallel to axis lines of the central axes 31. Furthermore, the winding parts 42 connected to the rotary tables 32 and the traction parts 41 connected to the winding parts 42 are also symmetrically arranged. Accordingly, two sides of the flexible display panel 1 may be uniformly stressed during a folding process, and damage to the display panel may be avoided. In some other embodiments, depending on actual situations, the two rotary tables 32 may be arranged asymmetrically. The present disclosure does not limit whether the two rotary tables 32 are symmetrically arranged.

Figure 5C:
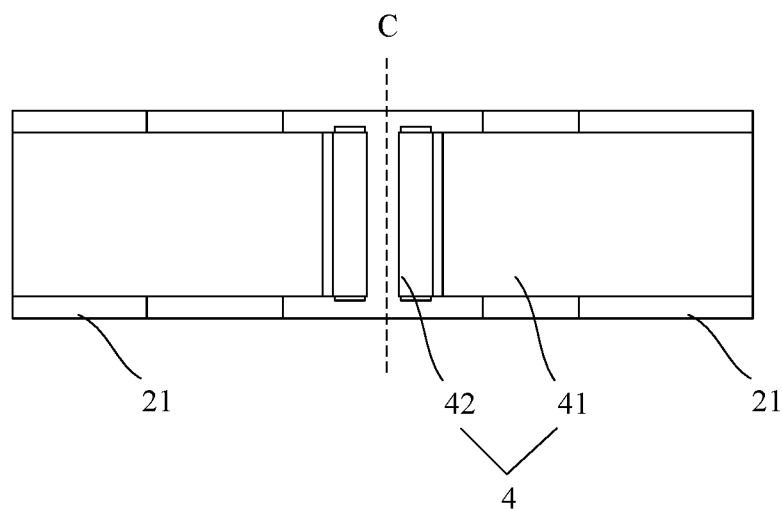
FIG. 5c illustrates a structural diagram of an exemplary display device consistent with the disclosed embodiments of the present disclosure.
Figure 5D:
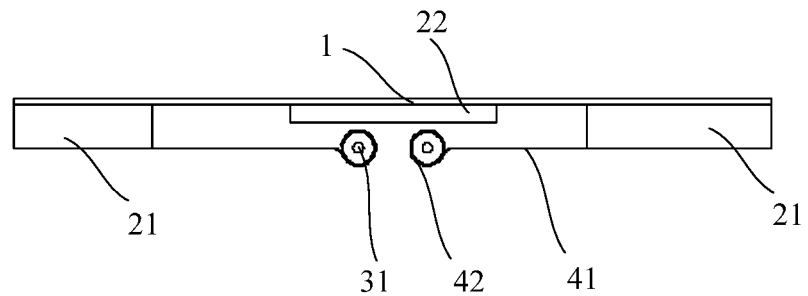
FIG. 5d illustrates a cross-sectional view of an exemplary display device consistent with the disclosed embodiments of the present disclosure.

In addition, dimensions of folding regions on two sides of the flexible display panel may be set to be different. FIG. 5c illustrates a structural diagram of an exemplary display device consistent with the disclosed embodiments of the present disclosure. FIG. 5d illustrates a cross-sectional view of an exemplary display device consistent with the disclosed embodiments of the present disclosure. As shown in FIG. 5c and FIG. 5d, dimensions of the first support parts 21 corresponding to the folding regions on two sides of the flexible display panel may be different. The folding region of the flexible display panel corresponding to a large first support part 51 has a larger dimension. In this configuration, if the two central axes 31 are symmetrically arranged along the symmetry axis C of the flexible display panel parallel to the axis lines of the central axes, one of the folding regions may be farther away from the central axis 31. Accordingly, the required traction force of the corresponding telescopic mechanism 4 may be greater, and during a folding process, forces applied on the two sides of the flexible display panel may be uneven.

In one embodiment, to apply even forces on the two sides of the flexible display panel, a telescopic mechanism corresponding to a larger folding region of the flexible display panel is provided with a larger traction force. That is, the elastic reset part corresponding to the larger folding region of the flexible display panel may have a larger force on the telescopic mechanism, such that forces on two sides of the flexible display panel may be balanced.

In some other embodiments, positions of the central axes 31 may be adjusted according to distances of the folding regions on two sides of the flexible display panel from the central axes. Accordingly, difference in lengths of the telescopic mechanisms corresponding to the two folding regions may be reduced.

In the present disclosure, a gap is between the first support part 21 and the second support part 22. A region of the flexible display panel 1 corresponding to the gap region includes a bending axis part. A width of the gap between the first support part 21 and the second support part 22 may be selected, such that the bending axis part of the display panel may normally bend.

In one embodiment, a fixed axis 5 may be also disposed at the gap between the first support part 21 and the second support part 22. The second end of the traction part 41 is fixedly connected to the second end of the winding part 42. The traction part 41 bypasses a side of the fixed axis 5 facing away from the flexible display panel 1, such that the first end of the traction part is fixedly connected to the side of the first support part 21 facing away from the flexible display panel 1. When the flexible display panel 1 is folded, the traction part 41 moves around the fixed axis 5, and the fixed axis 5 restricts a moving direction of the traction part 41. A position of the fixed axis 5 may be roughly determined by setting the fixed axis 5. Further, the fixed axis is on a non-display surface side of the flexible display panel 1 and restricts the moving direction of the traction part 41. Accordingly, during a movement process of the traction part 41, contact between the bending axis part of the flexible display panel 1 and traction part 41, which may damage the display panel, may be avoided.

In some other embodiments, the display device may have a suitable gap between the first support part 21 and the second support part 22, and the fixed axis 5 may not be provided. The present disclosure does not limit whether the fixed axis 5 is provided, and the fixed axis 5 may be provided according to actual situations.

In the present disclosure, to reduce a thickness of the display device, a thickness of the second support part 22 may be smaller than a thickness of the first support parts 21. As shown in FIG. 2a, the two rotation mechanisms 3 may be located on the side of the second support part 22 facing away from the flexible display panel 1, and the two rotation mechanisms 3 are located between the two first support parts 21. Accordingly, extra installation space of the two rotation mechanisms 3 may be saved.

In one embodiment, when the flexible display panel 1 is in a flattened state, rotation axes of the rotation mechanisms 3, surfaces of the fixed axes 5 facing away from the flexible display panel 1 and the surfaces of the first support parts 21 facing away from the flexible display panel 1 may be on a same plane. Accordingly, an installation space may be saved, a thickness of the display device may be reduced, and capabilities for being folded and flattened of the flexible display panel 1 may be achieved.

Figure 6A:
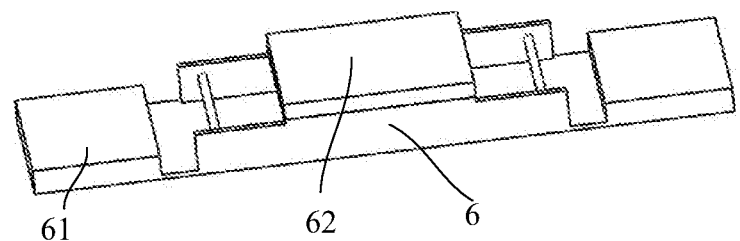
FIG. 6a illustrates a structural diagram of an exemplary framework consistent with the disclosed embodiments of the present disclosure.
Figure 6B:
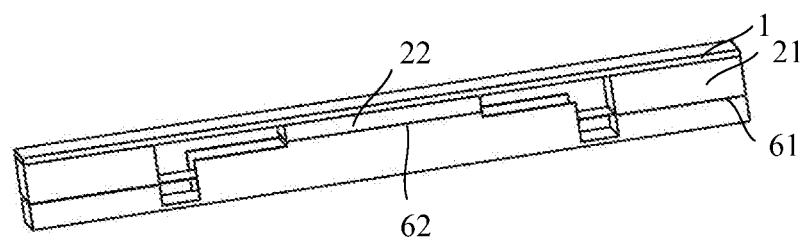
FIG. 6b illustrates a structural diagram of an exemplary display device consistent with the disclosed embodiments of the present disclosure.

FIG. 6a illustrates a structural diagram of an exemplary framework consistent with the disclosed embodiments of the present disclosure. FIG. 6b illustrates a structural diagram of an exemplary display device consistent with the disclosed embodiments of the present disclosure. In one embodiment, as shown in FIGS. 6a and 6b, the display device further includes a framework 6 on a side of the support mechanism 2 facing away from the flexible display panel 1. The framework 6 includes two first support plates 61 for respectively supporting the two first support parts 21 and a second support plate 62 for supporting the second support part 22 when the flexible display panel 1 is in a flattened state. The second support part 22 is fixedly connected to the second support plate 62.

Figure 6C:
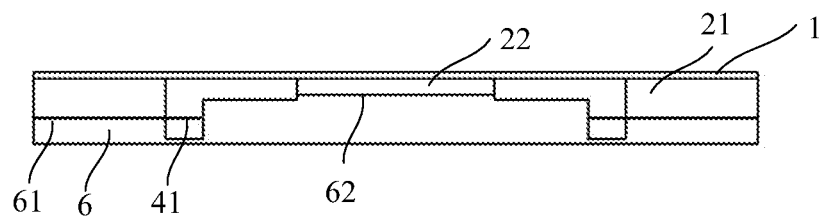
FIG. 6c illustrates a structural diagram of an exemplary display device consistent with the disclosed embodiments of the present disclosure.

FIG. 6c illustrates a structural diagram of an exemplary display device consistent with the disclosed embodiments of the present disclosure. As shown in FIG. 6c, when the flexible display panel 1 is in a flattened state, the first support plates 61 and second support plate 62 support the first support parts 21 and the second support part 22, and limit positions of the first support parts 21 and the second support part 22. Accordingly, the flexible display panel 1 may return to a straight and flat state and do not bend toward the non-display side.

Figure 7A:
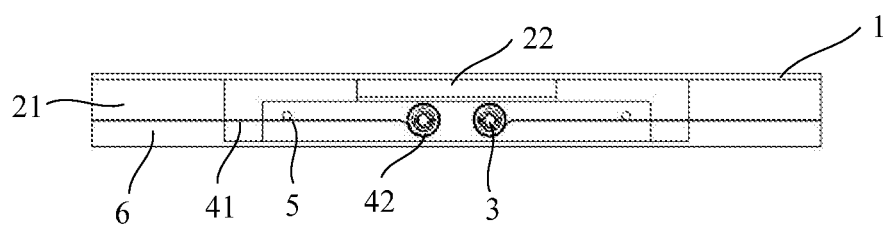
FIG. 7a illustrates a cross-sectional view of an exemplary display device consistent with the disclosed embodiments of the present disclosure.

FIG. 7a illustrates a cross-sectional view of an exemplary display device consistent with the disclosed embodiments of the present disclosure. As shown in FIG. 7a, when the flexible display panel 1 is in a flattened state, the first support plates 61 and the second support plate 62 of the framework 6 are in contact with the first support parts 21 and the second support part 22 of the support mechanism 2, respectively. The central axes 31 and the fixed axes 5 are disposed on the framework 6. The central axes 31 are located on a side of the second support plate 62 facing away from the second support part 22. That is, the rotation mechanisms 3 are located on a side of the second support plate 62 facing away from the support part. The winding parts 42 of the telescopic mechanisms 4 are wound around the rotation mechanisms 3. Gaps are between the first support plates 61 and the second support plate 62 of the framework 6. The fixed axes 5 are disposed in regions corresponding to the gaps. The second ends of the traction parts 41 of the telescopic mechanisms 4 are connected to the second ends of the winding parts 42. The first ends of the traction parts 41 bypass the sides of the fixed axes 5 facing away from the flexible display panel 1 and pass through the gaps between the first support plates 61 and the second support plate 62, and are connected to the first support parts 21.

Figure 7B:
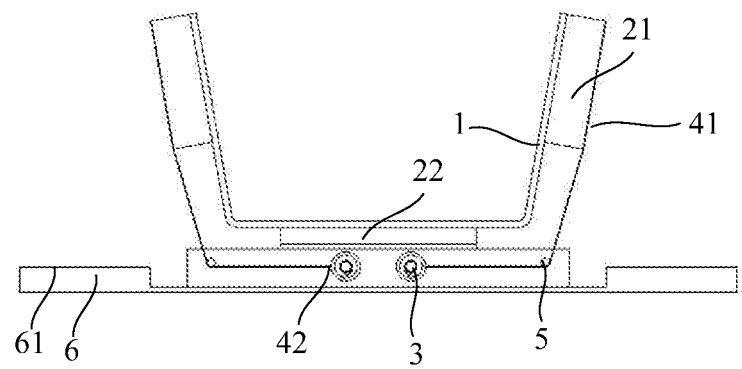
FIG. 7b illustrates a state diagram of an exemplary display device consistent with the disclosed embodiments of the present disclosure.

FIG. 7b illustrates a state diagram of an exemplary display device consistent with the disclosed embodiments of the present disclosure. In one embodiment, as shown in FIG. 7b, the second support part 22 is fixedly connected to the second support plate 62 of the framework 6. Relative positions between the two first support plates 61 and the second support plate 62 may be fixed. That is, positions of the two first support plates 61 of the framework 6 may be fixed. The first support parts 21 are not connected to the first support plates 61, and the first support plates 61 do not move with folding of the flexible display panel 1. In FIG. 7b, the second support part 22 is fixed to the second support plate 62 of the framework 6, while the first support parts 21 are not connected to the first support plates 61.

In some other embodiments, the first support parts 21 may be fixedly connected to the corresponding first support plates 61, and the second support part 22 may be fixedly connected to the corresponding second support plate 62. The first support plates 61 may move relative to the second support plate 62. That is, the first support plates 61 in the framework 6 may move when the flexible display panel 1 is folded.

Figure 8A:
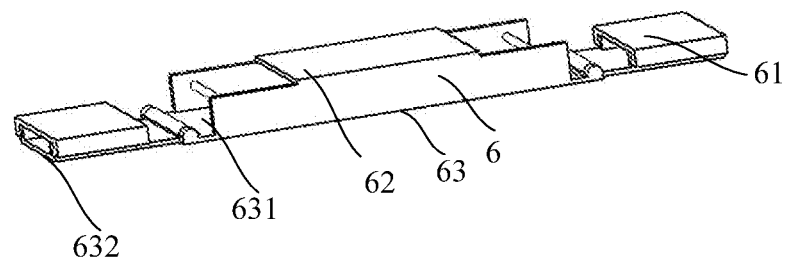
FIG. 8a illustrates a structural diagram of an exemplary framework consistent with the disclosed embodiments of the present disclosure.

FIG. 8a illustrates a structural diagram of an exemplary framework consistent with the disclosed embodiments of the present disclosure. As shown in FIG. 8a, in addition to the first support plates 61 and the second support plate 62, the framework 6 also includes a bottom plate 63 located on a side of the first support plates 61 and the second support plate 62 facing away from the flexible display panel 1. The first support plates 61 may move as the flexible display panel 1 is folded. The bottom plate 63 includes a fixed part 631 located in opposite to the second support plate 62 and two bending parts 632 corresponding to the two first support plates 61 respectively. The two bending parts 632 are rotatably connected to two ends of the fixed part 631, and the two bending parts 632 are slidably connected to the corresponding first support plates 61, respectively.

Figure 8B:
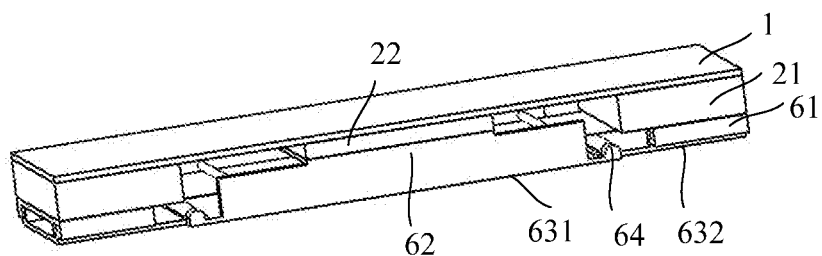
FIG. 8b illustrates a structural diagram of an exemplary display device consistent with the disclosed embodiments of the present disclosure.

FIG. 8b illustrates a structural diagram of an exemplary display device consistent with the disclosed embodiments of the present disclosure. As shown in FIG. 8b, when the flexible circuit board is in a flattened state, in the framework 6, the first support plates 61 and the second support plate 62 support the first support parts 21 and the second support part 22 respectively, and keep the flexible display panel in a flat and straight state.

Figure 9:
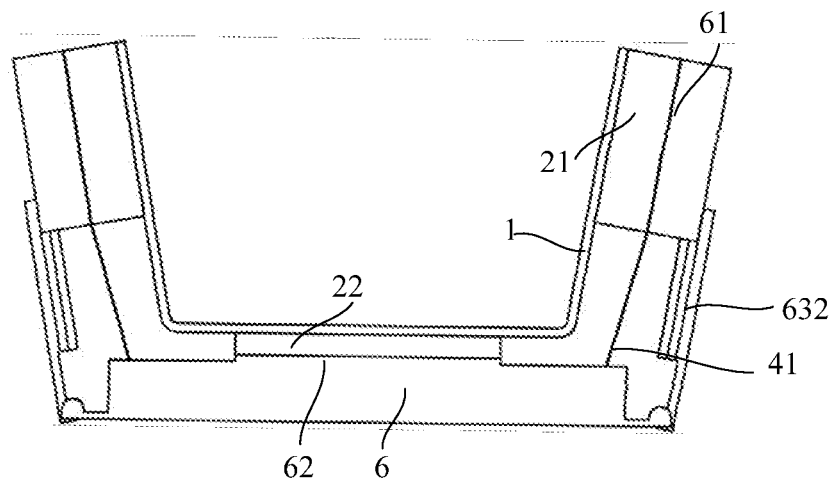
FIG. 9 illustrates a state diagram of an exemplary display device consistent with the disclosed embodiments of the present disclosure.

FIG. 9 illustrates a state diagram of an exemplary display device consistent with the disclosed embodiments of the present disclosure. As shown in FIG. 9, during a folding process of the flexible display device, since the first support plates 61 and the first support parts 21 are fixedly connected, the first support plates 61 may move following the first support parts 21. Due to the sliding connection between the first support plates 61 and the bending parts 632, the bending parts 632 on the bottom plate 63 corresponding to the first support plates 61 may follow movements of the first support plates 61 and flip relative to the fixed plate of the bottom plate 63. Accordingly, the framework 6 may bend when the flexible display panel 1 is folded.

Specifically, in the structure of the bottom plate 63 described above, the bending parts 632 and the fixed part 631 may be rotatably connected through a rotating axis.

Figure 10:
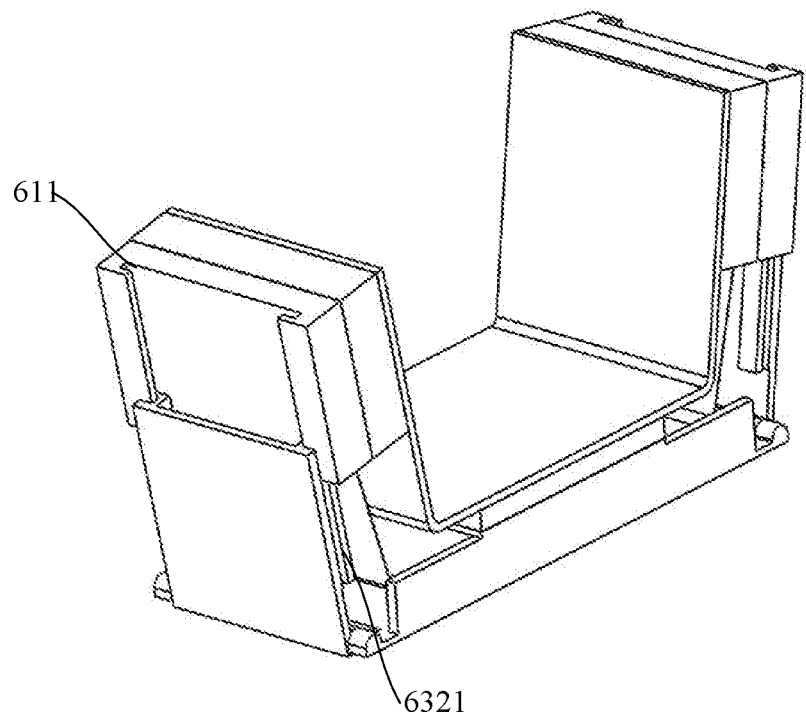
FIG. 10 illustrates a state diagram of an exemplary display device consistent with the disclosed embodiments of the present disclosure.

FIG. 10 illustrates a state diagram of an exemplary display device consistent with the disclosed embodiments of the present disclosure. FIG. 10 shows a specific structure of the sliding connection between the bending part 632 and the first support plate 61. As shown in FIG. 10, a surface of the bending part 632 facing the first support plate 61 is disposed with a sliding block 6321 perpendicular to an extending direction of the bending axis part of the flexible display panel 1. A surface of the first support plate 61 facing the bending part 632 has a slide rail 611 slidably engaged with the sliding block 6321. During a folding process of the flexible display panel 1, the first support plate 61 may bend along with the flexible display panel 1. Since the slide rail 611 on the first support plate 61 and the sliding block 6321 on the bending part 632 are slidably engaged, the first support plate 61 may drive the bending part 632 to bend with respect to the fixed part 631 of the bottom plate 63. In the display device, when the flexible display panel 1 bends, a bending angle of the flexible display panel 1 may be fixed by limiting a position of the sliding block 6321 in the slide rail 611.

Figure 11A:
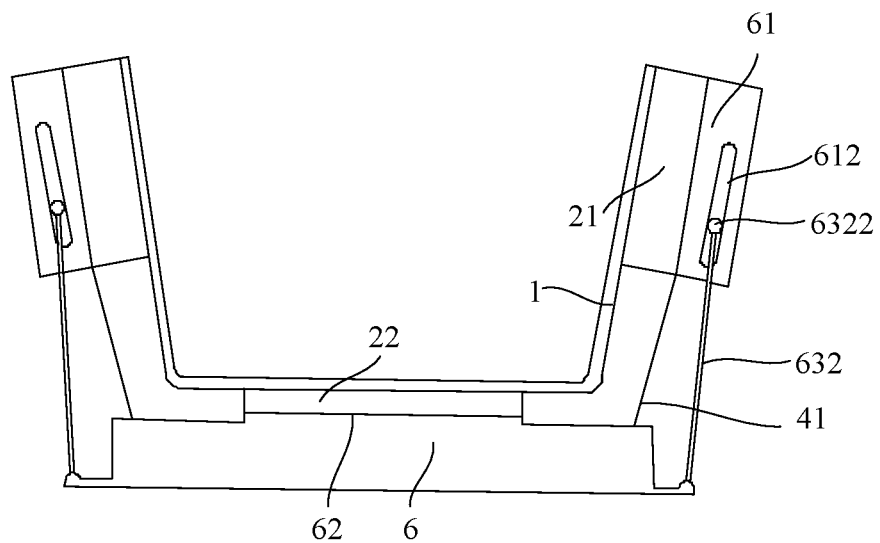
FIG. 11a illustrates a state diagram of an exemplary display device consistent with the disclosed embodiments of the present disclosure.
Figure 11B:
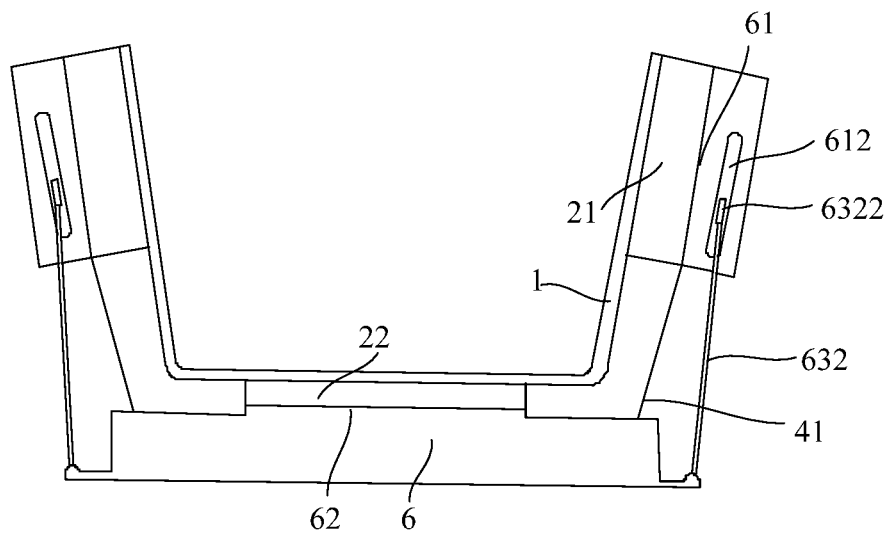
FIG. 11b illustrates a state diagram of an exemplary display device consistent with the disclosed embodiments of the present disclosure.
Figure 11C:
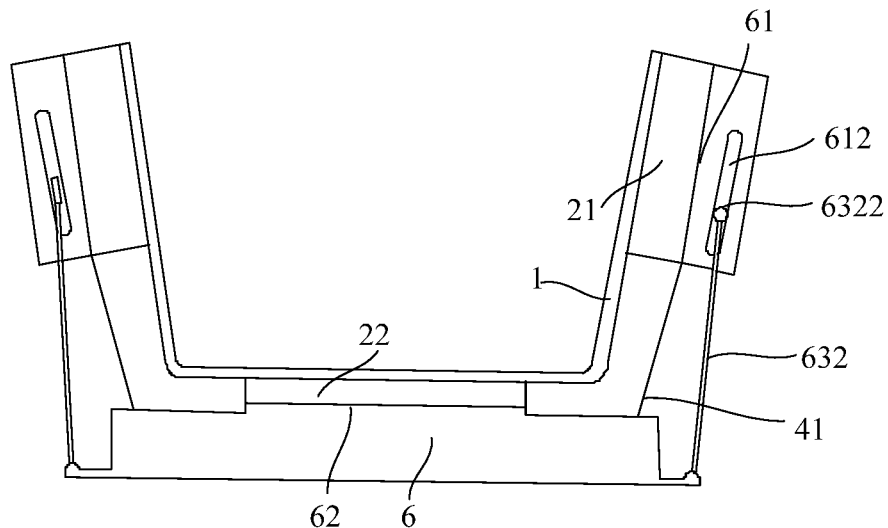
FIG. 11c illustrates a state diagram of an exemplary display device consistent with the disclosed embodiments of the present disclosure.

Each of FIGS. 11a, 11b, and 11c illustrates a state diagram of an exemplary display device consistent with the disclosed embodiments of the present disclosure. FIGS. 11a, 11b, and 11c show exemplary structures of the sliding connection between the bending part 632 and the first support plate 61. A sliding groove 612 may be formed on a side surface of the first support plate 61 perpendicular to the extending direction of the bending axis part of the flexible display panel 1. A connecting part 6322 may be formed at an end of the bending part 632 away from the fixed part 631, and the connecting part 6322 may be slidably connected in the sliding groove 612. During a folding process of the flexible display panel 1, the first support plate 61 may bend along with the flexible display panel 1. Since the sliding groove 612 on the first support plate 61 is slidably connected with the connecting part 6322 on the bending part 632, the first support plate 61 may drive the bending part 632 to bend with respect to the fixed part 631 of the bottom plate 63. The sliding groove 612 may be formed on one side surface of the first support plate 61, or may be formed on two opposite side surfaces of the first support plate 61. The slide groove 612 may be configured according to specific situations.

Specifically, as shown in FIG. 11a, the connecting part 6322 may be a cylindrical protrusion that is slidably connected with the sliding groove 612. The connecting part 6322 may slide in the sliding groove 612 and rotates along its own axis. Accordingly, the connecting part may have a high degree of freedom of motion, and bending smoothness of the flexible display panel may thus be improved.

Specifically, as shown in FIG. 11b, the connecting part 6322 may be a rectangular protrusion matching with the sliding groove 612. The connecting part 6322 may slide in the sliding groove 612, and may support the folding region of the flexible display panel and fix the bending angle of the flexible display panel.

As shown in FIG. 11a and FIG. 11b, the two connecting parts 6322 in a display device may both be configured as a cylindrical protrusion structure, or may both be configured as a rectangular protrusion structure. Or, as shown in FIG. 11c, one connecting part 6322 may be configured as a cylindrical protrusion structure and the other connecting part 6322 may be configured as a rectangular protrusion structure. The two connections 6322 may be configured according to actual situations, and the present disclosure does not limit configurations of the two connections 6322.

Specifically, the display device provided by the present disclosure may be any product or component having a display function, such as a mobile phone, a tablet computer, a television, a monitor, a notebook computer, a digital photo frame, and a navigator. Other essential components understood by those of ordinary skill in the art that should be included in a display device are not repeated in the present disclosure, and should not be used to limit the present disclosure.

As disclosed, the technical solutions of the present disclosure have the following advantages.

A display device provided by the present disclosure includes a flexible display panel, a support mechanism, two rotation mechanisms, and two telescopic mechanisms. The support mechanism is located on a non-display side of the flexible display panel. The support mechanism includes three support parts arranged in order when the flexible display panel is in a flattened state. The flexible display panel may be divided into three flat and straight regions. A region of the flexible display panel between two adjacent support parts includes a bending axis, and is a bendable area. Two rotation mechanisms are disposed on a side of the second support part facing away from the display panel, and the second support part is located in middle. Rotation axes of the rotation mechanisms are parallel to the bending axis of the flexible display panel. The two telescopic mechanisms are located on a side of the support mechanisms facing away from the flexible display panel. Each telescopic mechanism specifically includes a traction part and a winding part. A first end of each traction part is fixed to a side of one first support part facing away from the flexible display panel. The two winding parts are respectively wound on two rotation mechanisms. A first end of each winding part is fixed on one rotation mechanism, and a second end of the winding part is connected to a second end of one traction part.

When the flexible display panel is in a flattened state, the winding parts are wound on the rotation mechanisms. When the flexible display panel is folded, the regions of the flexible display panel corresponding to the two first support parts may be folded toward a side facing away from the support parts. The first support part drives the traction part to move, the traction part pulls the winding part, and the rotation mechanism rotates such that the winding part is pulled out by the traction part. When the winding part is completely pulled out, the flexible display panel may not continue to be folded.

The flexible display device may compensate the stretch and compression on the flexible display panel during a folding process through telescopic mechanisms. A length of the winding part of the telescopic mechanism that is pulled out may limit a maximum bending angle of the flexible display panel. Accordingly, the flexible display panel may not undergo excessive stretch and compression when the flexible display panel bends, and thus unacceptable damage to the flexible display panel that may affects image display may be avoided.

The embodiments disclosed herein are exemplary only and not limiting the scope of this disclosure. Various combinations, alternations, modifications, equivalents, or improvements to the technical solutions of the disclosed embodiments can be obvious to those skilled in the art. Without departing from the spirit and scope of this disclosure, such combinations, alternations, modifications, equivalents, or improvements to the disclosed embodiments are intended to be encompassed within the scope of the present disclosure.

What is claimed is:

1. A display device, comprising:
a flexible display panel, wherein the flexible display panel has a flattened state and a folded state;
a support mechanism located on a non-display surface side of the flexible display panel, wherein the support mechanism includes three support parts arranged in order when the flexible display panel is in the flattened state, and the three support parts include two first support parts located on two sides of the flexible display panel and a second support part located in middle of the flexible display panel, wherein a bending axis part is located at a region of the flexible display panel between any two adjacent support parts;
two rotation mechanisms located on a side of the second support part facing away from the flexible display panel, wherein rotation axes of the rotation mechanisms are parallel to a bending axis of the flexible display panel;
two telescopic mechanisms located on a side of the support mechanism facing away from the flexible display panel, wherein each telescopic mechanism includes a traction part and a winding part, first ends of the two traction parts are respectively fixed to sides of the two first support parts facing away from the flexible display panel, the two winding parts are respectively wound around the two rotation mechanisms, first ends of the two winding parts are respectively fixed on the rotation mechanisms, and second ends of the two winding parts are respectively connected to second ends of the two traction parts, wherein:
wherein each winding part is a sheet-shaped structure being rotatably wound around and unwound from a corresponding rotation mechanism;
when the flexible display panel is in the flattened state, the winding parts are wound around the rotation mechanisms; and
when the flexible display panel is in the folded state, the winding parts are unwound from the rotation mechanism while being pulled out by the traction parts.

2. The display device according to claim 1, wherein the traction parts and the winding parts of the telescopic mechanisms are made of inelastic materials.

3. The display device according to claim 1, wherein:
the traction part is sheet-shaped;
a first end of the sheet-shaped traction part is fixedly connected to the side of the first support part facing away from the flexible display panel; and
a second end of the sheet-shaped traction parts is connected to the second end of the winding part.

4. The display device according to claim 3, wherein:
the winding part connected to the traction part is a sheet-shaped structure wound around the rotation mechanism; and
the traction part and the winding part of the telescopic mechanism are integrally formed.

5. The display device according to claim 4, wherein:
when the traction part and the winding part are integrally formed, the telescopic mechanism is an ultra-thin metal sheet;
a first end of the ultra-thin metal sheet is fixed to the rotation mechanism, and a region of the ultra-thin metal sheet close to the first end is wound around the rotation mechanism; and
a second end of the ultra-thin metal sheet is fixedly connected to the side of the first support part facing away from the display panel.

6. The display device according to claim 1, wherein the rotation mechanism includes a central axis that is fixed, a rotary table put on the central axis, and an elastic reset part connected to the central axis and the rotary table respectively, wherein:
when the flexible display panel is in the flattened state, the winding part is wound on the rotary table, and the elastic reset part is in an initial state; and
when the flexible display panel is in the folded state, the winding part is pulled out by the traction part, and the elastic reset part is in a stressed state.

7. The display device according to claim 6, wherein:
the elastic reset part includes a torsion spring;
the torsion spring is disposed between the central axis and the rotary table; and
one end of the torsion spring is connected to the central axis and the other end of the torsion spring is connected to an inner wall of the rotary table.

8. The display device according to claim 6, wherein the two rotation mechanisms share a same central axis, and the two rotary tables are put on the same central axis in an offset manner.

9. The display device according to claim 6, wherein:
each rotation mechanism includes a central axis, and the two central axes of the two rotation mechanisms are arranged side by side; and
the rotary tables are put on the central axes in one to one correspondence.

10. The display device according to claim 9, wherein the two rotary tables are symmetrically arranged along a symmetry axis parallel to axis lines of the central axes.

11. The display device according to claim 6, wherein:
a gap is between the first support part and the second support part;
a fixed axis is disposed at the gap between the first support part and the second support part; and
the traction part is located at a side of the fixed axis facing away from the flexible display panel.

12. The display device according to claim 11, wherein a thickness of the second support part is smaller than a thickness of the first support parts.

13. The display device according to claim 12, wherein rotation axes of the rotation mechanisms, surfaces of the fixed axes facing away from the flexible display panel and surfaces of the first support parts facing away from the flexible display panel are on a same plane.

14. The display device according to claim 8, further comprising a framework on a side of the support mechanisms facing away from the flexible display panel, wherein:
the framework includes two first support plates for respectively supporting the two first support parts and a second support plate for supporting the second support part when the flexible display panel is in the flattened state; and
at least the second support part is fixedly connected to the second support plate.

15. The display device according to claim 14, wherein:
the central axes and the fixed axes are disposed on the framework;
the central axes are located on a side of the second support plate facing away from the flexible display panel; and
a gap is between the first support plate and the second support plate, and the fixed axis is located at the gap between the first support plate and the second support plate.

16. The display device according to claim 15, wherein:
the second support part is fixedly connected to the second support plate; and
relative positions between the two first support plates and the second support plate are fixed.

17. The display device according to claim 15, wherein:
the first support parts are fixedly connected to the corresponding first support plates, and the second support part is fixedly connected to the corresponding second support plate; and
the first support plates may move relative to the second support plate.

18. The display device according to claim 17, wherein:
the framework includes a bottom plate located on a side of the first support plates and the second support plate facing away from the flexible display panel;
the bottom plate includes a fixed part located in opposite to the second support plate and two bending parts corresponding to the two first support plates respectively; and
the two bending parts are rotatably connected to two ends of the fixed part, and the two bending parts are slidably connected to the corresponding first support plates, respectively.

19. The display device according to claim 18, wherein the bending parts and the fixed part are rotatably connected through rotation axes.

20. The display device according to claim 18, wherein:
- a surface of the bending part facing the first support plate is disposed with a sliding block perpendicular to an extending direction of the bending axis part of the flexible display panel;
- a surface of the first support plate facing the bending part is disposed with a sliding rail engaged with the sliding block; and
- when the flexible display panel is in the folded state, the sliding rail is engaged and slidably connected with the sliding block.

\* \* \* \* \*